United States Patent [19]

Sava et al.

[11] Patent Number: 4,459,578

[45] Date of Patent: Jul. 10, 1984

[54] FINGER CONTROL JOYSTICK UTILIZING HALL EFFECT

[75] Inventors: Robert J. Sava, San Jose; Roy J. Machamer, Santa Clara, both of Calif.

[73] Assignee: Atari, Inc., Sunnyvale, Calif.

[21] Appl. No.: 457,771

[22] Filed: Jan. 13, 1983

[51] Int. Cl.[3] ...................... H01C 10/16; H01L 43/06

[52] U.S. Cl. ................................ 338/128; 338/32 H; 338/90; 200/6 A; 74/471 XY; 273/148 B

[58] Field of Search ..................... 338/32 H, 32 R, 90, 338/91, 128–131; 323/294, 368; 324/251; 200/6 A; 74/471 XY; 273/148 B

[56] References Cited

U.S. PATENT DOCUMENTS

| | | | |
|---|---|---|---|
| 3,112,464 | 11/1963 | Ratajski et al. | 338/32 |
| 3,170,323 | 2/1965 | Kuhrt et al. | 73/136 |
| 3,331,971 | 7/1967 | Möller | 338/128 |
| 3,331,972 | 7/1967 | Möller | 338/128 |
| 3,942,148 | 3/1976 | Nishioka | 338/128 |
| 4,107,604 | 8/1978 | Bernier | 338/32 H X |
| 4,161,726 | 7/1979 | Burson et al. | 74/471 XY X |
| 4,216,467 | 8/1980 | Colston | 340/365 |
| 4,293,837 | 10/1981 | Jaffe et al. | 323/368 |

FOREIGN PATENT DOCUMENTS

| | | | |
|---|---|---|---|
| 2242178 | 8/1976 | Fed. Rep. of Germany | 200/6 A |

OTHER PUBLICATIONS

Hall Effect Transducers, Honeywell, Division (6 pp.), (Reference), Micro Switch Division, pp. 157–159, ©1982.

Joystick Control (1 p.), Electronics Weekly, (An Advertisement), Nov. 24, 1982.

*Primary Examiner*—Roy N. Envall, Jr.
*Assistant Examiner*—Christopher N. Sears
*Attorney, Agent, or Firm*—Kenneth E. Leeds

[57] ABSTRACT

Hall effect elements are placed in proximity to magnets in such a way that the position of the magnets relative to the Hall elements is a function of the position of a joystick controller. In this way, the position of the joystick can be "read" by a machine by reference to the Hall effect voltage.

15 Claims, 5 Drawing Figures

FINGER CONTROL JOYSTICK UTILIZING HALL EFFECT

BACKGROUND OF THE INVENTION

This invention relates generally to video games; and more specifically, to joystick control mechanisms for video games. Joysticks allow the user to input data of the nature of a vector or a discrete state into a game unit, such as a microprocessor controlled video system.

Currently, joystick mechanisms exploit different methods to translate positional information represented by the joystick orientation into electrical signals. One such scheme involves the use of a pair of potentiometers, e.g., as is disclosed in U.S. Pat. application Ser. No. 06/337,881, filed Jan. 7, 1982 by Asher and assigned to the present Assignee. In such a design, the voltage across a potentiometer is made proportional to the displacement of the joystick along a particular axis (e.g., a vector).

Another scheme for translating the position of a joystick into an eletrical signal is through the use of dome switches, e.g., as disclosed in U.S. Pat. No. 4,319,099 entitled "Dome Switcn Having Contacts Offering Extended Wear." In the mechanism shown in that Patent, movement of the joystick toward a dome switch will bring about pressure on the dome switch, closing an electrical connection. In that way, the game can "tell" if the user is pushing the joystick in a particular direction (e.g., a discrete state).

These patents are illustrative of prior art joysticks, and although each of them functions very well as a game controller, it may still be possible to improve upon their structures. In particular, since these prior art joysticks require moving electrical contacts, stress and fatigue may be introduced into the joystick unit, with attendant reliability problems In addition, both of these mechanisms have certain resolution limitations.

SUMMARY OF THE INVENTION

The present invention uses the Hall effect to monitor the position of a joystick. The Hall effect creates a voltage across a conductive strip in which current is flowing, when the strip is placed in a magnetic field. This is because magnetic fields exert forces on moving charged particles, such as electrons. Thus, electrons flowing through a "Hall element" will be pulled toward one region of the Hall element, where their presence will create an electric field, with a resultant "Hall effect voltage".

In one preferred embodiment, movement of the joystick in the direction of one axis moves a permanent magnet further from one Hall element and closer to another. Proximity of the magnet to the Hall element creates a Hall effect voltage, a representation of which is communicated to the video game unit. For example the voltage may be applied to a Schmitt trigger, the resulting change of state of the Schmitt trigger being read by *the game* unit. As the joystick is moved into a neutral position, the strength of the magnetic field through the Hall element is reduced generating less Hall effect voltage causing the Schmitt trigger to change state again.

In a preferred embodiment, there are four Hall elements in fixed positions, and two magnets which move in accordance with movement of the joystick but only in a given axis. Therefore, the two magnets are capable of motion in mutually perpendicular directions, and eight joystick positions (plus neutral) can be detected.

This can be seen as follows: Each magnet is capable of activating either of two Hall elements, depending upon position of the joystick. If the joystick is in a neutral position, none of the Hall elements will be activated. If the joystick is pushed along the axis of movement of one magnet, that magnet will move closer to a particular Hall element, causing a change in its Hall effect voltage and a change of state of its associated Schmitt trigger. If the joystick is pushed at an angle of 45 degrees from that axis, both magnets will move, and two Hall elements will generate a Hall effect voltage capable of changing the state of their associated Schmitt triggers. If the joystick is pushed at an angle, 180 degrees from the first angle, each magnet will move toward the other Hall element associated with it.

If the joystick is pushed at an angle less than 45 degrees but greater than zero degrees, both magnets will move as a function of the joystick position projected along their respective axes of movement. Whether both Schmitt triggers change state or only one Schmitt trigger changes state is dependent upon the physical placement and characteristics of the Hall element and the magnets, but typically, there is a range between some angle less than 45 degrees and greater than 45 degrees in which both Hall elements would activate their associated Schmitt triggers, and beyond which only one Schmitt trigger would fire.

Therefore, the joystick mechanism can discern eight positions or essentially eight discrete position regions (any one of the four Schmitt triggers changing state, or any pair of adjacent Schmitt triggers changing state simultaneously plus a neutral zone (no Schmitt triggers active).

Another embodiment of the invention calls for only two Hall elements. The voltage across each Hall element is an analog representation of the position of the joystick along a particular axis, and each Hall element is capable of registering positive and negative displacements relative to an associated magnet. The resulting Hall effect voltages are then components of the total displacement vector of the joystick, in this case cartesian x, y values. The voltages so generated represent the resolved position of the joystick in electrical terms that can be processed by the game unit for position information.

DETAILED DESCRIPTION OF THE DRAWINGS

Figure 1:
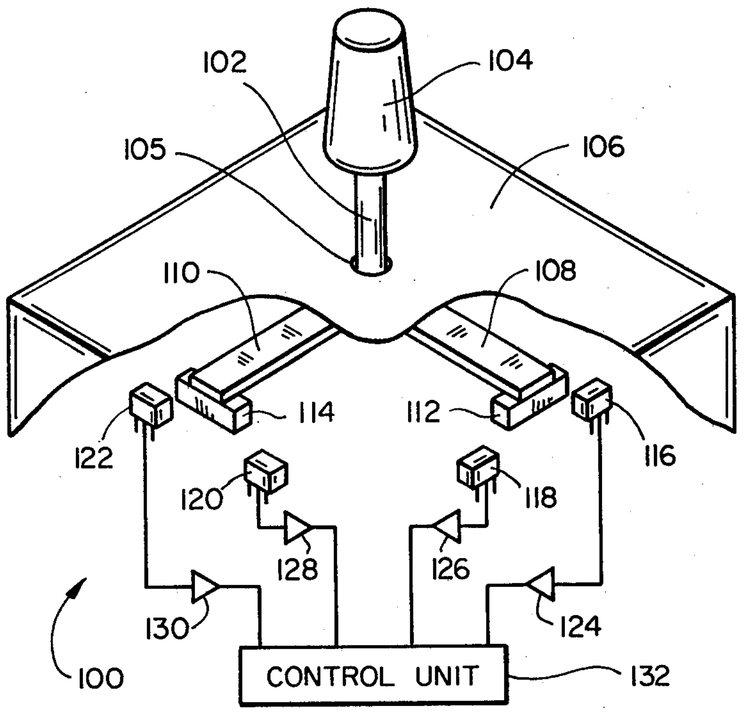
FIG. 1 is a schematic illustration of aspects of a joystick incorporating features of the invention.

In FIG. 1, there is shown a joystick game control unit 100 having a joystick shaft 102. A knob 104 sits on one end of joystick shaft 102, while the other end is attached to a ball joint (not shown in FIG. 1), thereby allowing motion of joystick shaft 102. Joystick shaft 102 passes through an opening 105 into a housing 106.

Inside housing 106 is an arm 108 and an arm 110 which responds to motion of joystick shaft 102 in a manner to be discussed later. Affixed to arm 108 is a magnet 112, and affixed to arm 110 is a magnet 114. Associated with and in proximity to magnet 112 are Hall elements 116 and 118. Associated with and in proximity to magnet 114 are Hall elements 122 and 120. The Hall effect voltage output from Hall element 116 is connected to the input of a Schmitt trigger 124. Similarly, the Hall effect voltage output from Hall element 118 is connected to Schmitt trigger 126, the Hall effect voltage output from Hall element 120 is connected to Schmitt trigger 128 and the Hall effect voltage output from Hall element 122 is connected to Schmitt trigger 130. The outputs from Schmitt triggers 124, 126, 128, and 130 are fed into a game control unit 132, which may be, for example one of the video games available from Atari, Inc. in Sunnyvale, Calif. It is well understood by those skilled in the art that Schmitt triggers are electronic devices which create a digital output signal based on the voltage present at the input.

In operation, when knob 104 is pushed in a particular direction, shaft 102 is tilted. Arm 108 moves in response to the tilt of joystick shaft 102 along the major axis of magnet 112, while arm 110 moves in response to the tilt of joystick shaft 102 along the major axis of magnet 114. Therefore, by pushing knob 104 in a particular direction, one moves magnet 112 closer to Hall element 116. As magnet 112 gets closer to Hall element 116, the magnitude of the Hall effect voltage increases. The Hall effect voltage is presented to the input of Schmitt trigger 124, which changes state when magnet 112 creates a sufficient Hall effect voltage across Hall element 116.

As joystick shaft 102 returns to a neutral position, the Hall effect voltage across Hall element 116 decreases, with the result that Schmitt trigger 124 will again change state. The output of Schmitt trigger 124 is monitored by game control unit 132. In a similar way, Hall element 118 responds to its proximity to magnet 112, and Hall elements 120, and 122 respond to their proximity to magnet 114. The Hall effect voltage from Hall elements 118, 120, and 122 are available at the inputs of Schmitt triggers 126, 128, and 130, respectively. The outputs of Schmitt triggers 126, 128, and 130 are all monitored by game control unit 132, which is therefore capable of responding to the tilt of joystick shaft 102.

Typically, a Schmitt trigger and Hall element are contained in one unit, such as device model number UGN-3020T, available from the semiconductor division of Sprague Electric Company. Such a unit provides a discrete state output. In this embodiment, each magnet would be in the shape of a rectangular prism, with a major axis of 7/16 inches. The two Hall elements would be roughly $\frac{5}{8}$ inches apart. The axis of travel of each magnet bring it to within about 1/16 inch of each Hall element.

Figure 2:
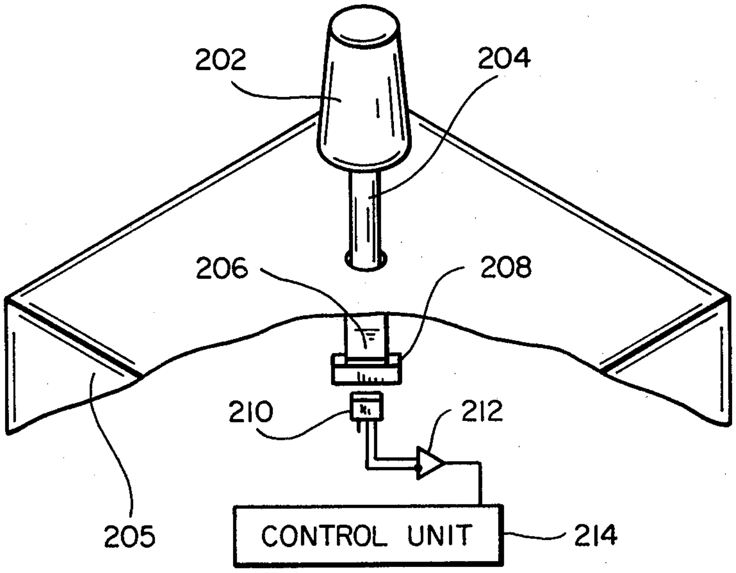
FIG. 2 is a schematic illustration of aspects of a second embodiment of this invention.

FIG. 2 represents an alternative embodiment of the invention. A knob 202 is affixed to the end of a joystick shaft 204, which extends into a housing 205. An arm 206 is located wthin housing 205. A magnet 208 is affixed to the end of arm 206. A Hall element 210, in proximity to magnet 208, is affixed to housing 205. The Hall effect voltage generated by Hall element 210 is presented to the input of a differential amplifier 212. Arm 206 moves in accordance with the tilt of joystick shaft 204 projected onto the major axis of magnet 208. Therefore, magnet 208 moves in accordance with the motion of joystick shaft 204.

As magnet 208 changes position, the strength of the magnetic field surrounding Hall element 210 changes. The resulting Hall effect voltage output is presented to a differential amplifier 212, whose output is monitored by a game control unit 214. In this way, the game control unit 214 can monitor the position of the joystick 204. Typically, a Hall element and differential amplifier would be contained in one unit such as device model number DN6835, available from Panasonic Corporation. Such a unit presents an analog output proportional to position (e.g., a vector component).

Figure 3:
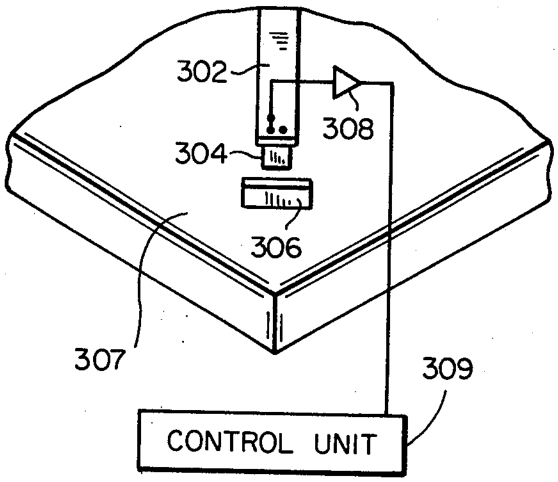
FIG. 3 is an illustration of aspects of a third embodiment of this invention.

Yet another embodiment of the invention is presented in FIG. 3. A movable arm 302 has a Hall element 304 affixed thereon. In this embodiment, movable arm 302 moves in response to a joystick shaft (not shown). A magnet 306 is affixed to a base 307. The Hall effect voltage generated by Hall element 304 is presented to an amplifier 308 which is monitored by a game control unit 309. The Hall effect voltage generated across Hall element 304 is a function of its position relative to magnet 306. As arm 302 moves, Hall element 304 moves causing a change in the Hall effect voltage.

Figure 4:
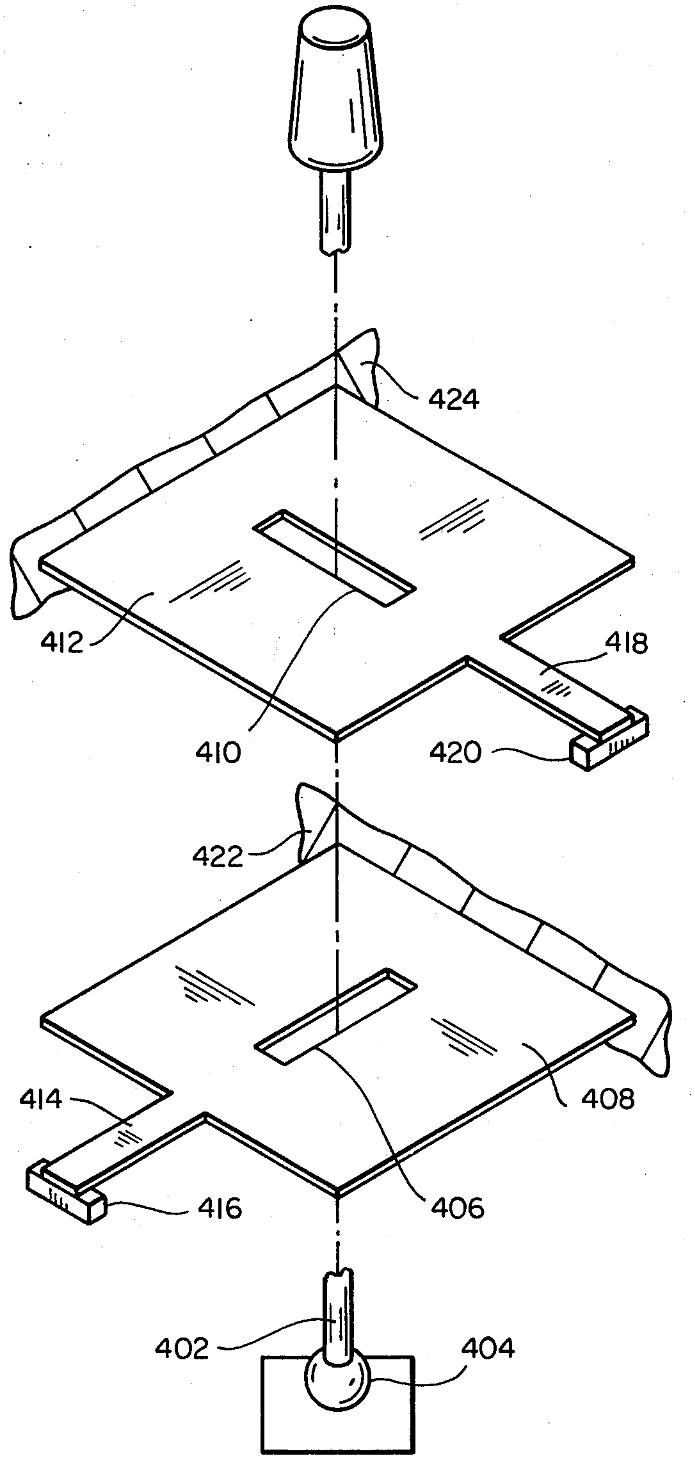
FIG. 4 is an exploded view of joystick mechanisms.

FIG. 4 shows a typical mechanical assembly for use with the invention. A joystick shaft 402 terminates at a ball joint 404. Joystick shaft 402 is fed through an oblong aperture 410 of a plate 412. A plate 408 has an arm 414 upon which is affixed a magnet 416. Similarly, plate 412 has an arm 418 upon which is affixed a magnet 420. A wall 422 prevents plate 408 from sliding along the direction of the major axis of aperture 406. Similarly, a wall 424 prevents plate 412 from sliding along the direction of the major axis of aperture 410.

Plate 408, typically being parallel to plate 412, may slide across plate 412. Plate 408 is movable along the minor axis of aperture 406, while plate 412 is movable along the minor axis of aperture 410. Aperture 410 and aperture 406 are mutually perpendicular. Joystick shaft 402 governs the motion of plate 412 and 408, so that plate 412 will follow the motion of joystick shaft 402 projected along the minor axis of aperture 410, and plate 408 will follow the motion of joystick shaft 402 projected along the minor axis of aperture 406. Arm 414 and magnet 416 will follow the motion of plate 408, while arm 418 and magnet 420 will follow the motion of plate 412.

Figure 5:
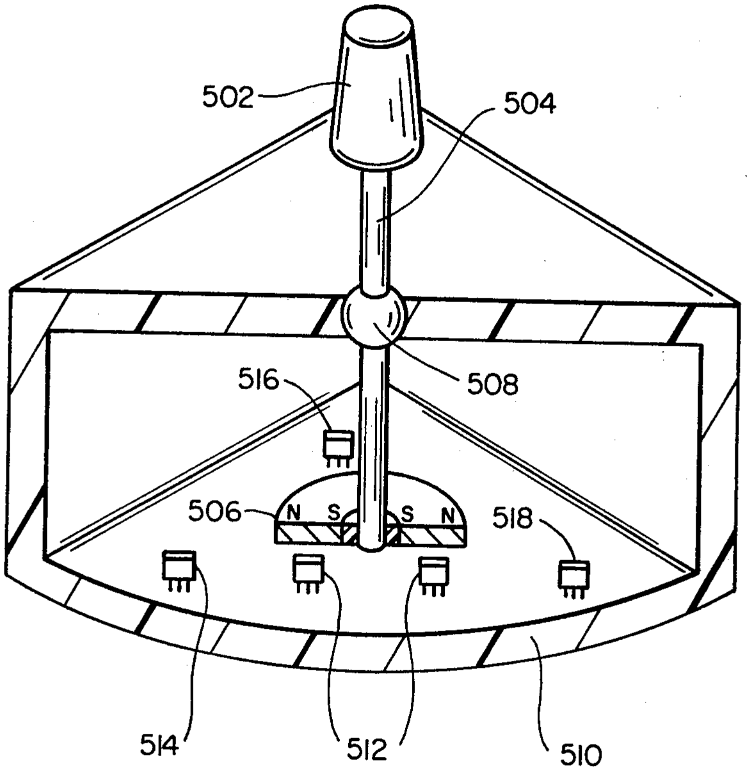
FIG. 5 is an illustration of a fourth embodiment of this invention.

A further embodiment of the invention is disclosed in FIG. 5. Knob 502 is affixed to one end of joystick shaft 504. Annular magnet 506 is affixed to the other end of joystick shaft 504. Annular magnet 506 has a "south pole" toward its center while its "north pole" is located at its circumference.

Joystick shaft 504 pivots about ball joint 508. Affixed to housing 510 are Hall elements 512. When joystick shaft 504 is in its neutral position, Hall elements 512 are below annular magnet 506. In the neutral position, these Hall elements will register a negligible amount of Hall effect voltage. As knob 502 is pushed, annular magnet 506 moves, and thereby alters the magnet field present at Hall elements 512, causing a change in the associated Hall effect voltage which can be presented to the input of an amplifier (not shown).

Hall elements 514, 516, and 518 may be affixed to housing 510 as well. In the neutral position, annular magnet 506 would be at rest a sufficient distance from Hall elements 514, 516, and 518 so that each of them would generate only a negligible Hall effect voltage. When knob 502 is pushed to the left, annular magnet 506 will move to the right, approaching Hall element 518, with the result that the magnetic field at the location of Hall element 518 will increase. Therefore, the Hall effect voltage produced by Hall element 518 will increase, and will trigger a change of state of a Schmitt trigger which can be monitored by a game control unit, as discussed above in connection with FIGS. 1-4.

We claim:

1. A controller mechanism comprising:
a housing;
a joystick shaft;
first magnetic means in said housing for movement along a first axis in response to the position of said joystick shaft projected along said first axis;
a first Hall element in said housing, a voltage being generated across said first Hall element which is a function of the position of said first Hall element relative to said first magnetic means;
a second magnetic means in said housing for movement along a second axis in response to the position of said joystick shaft projected along said second axis;
a second Hall element in said housing, a voltage being generated across said second Hall element which is a function of the position of said second Hall element relative to said second magnetic means;
a first plate in said housing having an oblong aperture through which said joystick shaft is inserted, the major axis of said aperture being in the direction of said second axis;
a first arm extending from said first plate, said first magnetic means being mounted on said first arm;
a second plate in said housing parallel to said first plate, and having an oblong aperture through which said joystick shaft is inserted, and the major axis of said aperture being in the direction of said first axis; and
a second arm extending from said second plate, said second magnetic means being mounted on said second arm.

2. The controller mechanism in claim 1 wherein said first axis is perpendicular to said second axis.

3. A controller mechanism as in claim 2 further comprising:
means for preventing said first plate from moving along said second axis and
means for preventing said second plate from moving along said first axis.

4. A controller mechanism comprising:
a housing;
control means;
first magnetic means in said housing for movement along a first axis in response to the position of said control means projected along said first axis;
a first Hall element in said housing, a voltage being generated across said first Hall element which is a function of the position of said first Hall element relative to said first magnetic means;
a second magnetic means in said housing for movement along a second axis in response to the position of said control means projected along said second axis;
a second Hall element in said housing, a voltage being generated across said second Hall element which is a function of the position of said second Hall element relative to said second magnetic means; and
wherein a first set of two Hall elements is affixed to said housing such that the voltage being generated across each Hall element of said first set is a function of its proximity to said first magnetic means, and wherein a second set of two Hall elements if affixed to said housing such that the voltage being generated across each Hall element of said second set is a function of its proximity to said second magnetic means.

5. A joystick mechanism comprising:
a joystick shaft;
a first arm restricted to motion along only a first axis, the position of said first arm along said first axis being determined by the position of said joystick shaft along said first axis;
a first magnet affixed to said first arm;
a second arm restricted to motion along only a second axis, said second axis being perpendicular to said first axis, the position of said second arm along said second axis being determined by the position of said joystick shaft along said second axis;
a first set of at least one Hall element associated with said first magnet, each element of said first set registering a change in magnetic field strength created by said first magnet indicative of a change of position relative to said first magnet and
a second set of at least one Hall element associated with said second magnet, each element of said second set registering a change in magnetic field strength created by said second magnet indicative of a change of position relative to said second magnet.

6. The joystick mechanism in claim 5 further comprising:
first clipping means having inputs derived from the voltage across said first Hall element, said first clipping means generating a digital output responsive to said Hall element voltage;
second clipping means having inputs derived from the voltage across said second Hall element, said second clipping means generating a digital output off of the voltage generated across said second Hall element.

7. A joystick controller for governing objects on a video display comprising:
a first plate mounted for movement along a first axis, and having a first oblong aperture, whose major axis is oriented along a second axis, perpendicular to said first axis;
a second plate mounted to movement along said second axis and having a second oblong aperture, whose major axis is oriented along said first axis;
a joystick shaft inserted through said first aperture and said second aperture, said joystick shaft governing movement of said first second plates;
a first arm extending from said first plate;
a second arm extending from said second plate;
a first magnet affixed to said first arm;
a second magnet affixed to said second arm;
means for restraining said first plate from moving along the direction of said second axis;
means for restraining said second plate from moving along the direction of said first axis;
a first Hall element in proximity to said first magnet, said first Hall element being fixed in location, the voltage generated across said first Hall element being determined by the position of said first magnet to said first Hall element;
a second Hall element in proximity to said second magnet, said second Hall element being fixed in location, the voltage generated across said second Hall element being determined by the position of said second magnet relative to said first Hall element.

8. A joystick mechanism comprising:

a housing;

a joystick shaft;

a first arm capable of movement along a first axis, in response to the postion of said joystick shaft projected along said first axis, said first arm located within said housing;

a first Hall element affixed to said arm;

a second arm capable of movement along a second axis in response to the position of said joystick shaft projected along said second axis, said second arm located within said housing;

a second Hall element affixed to said second arm;

a first magnet affixed to said housing such that the magnetic field created by said magnet generates a detectable Hall effect voltage across said first Hall element; and a second magnet affixed to said housing such that the magnetic field created by said magnet generates a detectable Hall effect voltage across said first Hall element.

9. A joystick mechanism oomprising:

a joystick shaft;

a magnet affixed to one end of said joystick shaft;

a housing;

a first Hall element affixed to said housing, a voltage being generated across said first Hall element which is a function of the position of said first Hall element relative to said first magnetic means.

10. The mechanism in claim 9 further comprising a ball joint through which said joystick shaft pivots.

11. The mechanism in claim 9 said magnet is an annular magnet.

12. The mechanism in claim 9 further comprising a second Hall element affixed to said housing, a voltage being generated second Hall element which is a function of the position of said second Hall element relative to said magnet.

13. A joystick controller comprising:

a joystick shaft;

a first arm restricted to motion along only a first axis, the position of said first arm along said first axis being determined by the position of said joystick shaft along said first axis;

a first magnet affixed to said first arm;

a second arm restricted to motion along only a second axis, said second axis being perpendicular to said first axis, the position of said second arm along said second axis being determined by the position of said joystick shaft along said second axis;

a second magnet affixed to said second arm;

a first Hall element associated with said first magnet, said first Hall element generating a voltage indicative of the proximity of the first magnet to the first Hall element;

a second Hall element associated with said first magnet, said second Hall element generating a voltage indicative of the proximity of the first magnet to the second Hall element;

a third Hall element associated with said second magnet, said third Hall element generating a voltage indicative of the proximity of the second magnet to the third Hall element; and a fourth Hall element associated with said second magnet, said fourth Hall element generating a voltage indicative of the proximity of the second magnet to the fourth Hall element.

14. A joystick controller as in claim 13 further comprising:

first means for generating a digital signal coupled to the first Hall element, the first means generating a digital signal in response to the voltage generated by the first Hall element, the output of the first means going into a first state in response to the first magnet being closer than a predetermined distance from the first Hall element, the output of the first means going into a second state opposite the first state in response to the first magnet being further than the predetermined distance from the first Hall element;

second means for generating a digital signal coupled to the second Hall element, the second means generating a digital signal in response to the voltage generated by the second Hall element, the output of the second means going into a first state in response to the first magnet being closer than a predetermined distance from the second Hall element, the output of the second means going into a second state opposite the first state in response to the first magnet being further than the predetermined distance from the second Hall element;

third means for generating a digital signal coupled to the third Hall element, the third means generating a digital signal in response to the voltage generated by the third Hall element, the output of the third means going into a first state in response to the first magnet being closer than a predetermined distance from the third Hall element, the output of the third means going into a second state opposite the first state in response to the first magnet being further than the predetermined distance from the third Hall element; and fourth means for generating a digital signal coupled to the fourth Hall element, the fourth means generating a digital signal in response to the voltage generated by the fourth Hall element, the output of the fourth means going into a first state in response to the first magnet being closer than a predetermined distance from the fourth Hall element, the output of the fourth means going into a second state opposite the first state in response to the first magnet being further than the predetermined distance from the fourth Hall element.

15. A joystick controller as in claim 14 further comprising monitoring means for monitoring the state of the first, second, third, and fourth means, the first, second, third, and fourth Hall elements being placed so that the monitoring means can detect eight distinct positions of the joystick shaft.

* * * * *